US005575546A

United States Patent [19]
Radloff

[11] Patent Number: 5,575,546
[45] Date of Patent: Nov. 19, 1996

[54] APPARATUS FOR RETENTION OF COMPUTER EXPANSION CARDS AND FILLER PANELS

[75] Inventor: Timothy Radloff, Austin, Tex.

[73] Assignee: Dell U.S.A., L.P., Austin, Tex.

[21] Appl. No.: 505,501

[22] Filed: Jul. 21, 1995

[51] Int. Cl.[6] .................................................. B42F 17/16
[52] U.S. Cl. ...................... 312/183; 312/187; 312/193.4; 312/223.1; 361/683; 361/686; 361/726; 361/740; 361/759; 361/801; 439/135; 439/345; 174/35 R
[58] Field of Search ................................ 312/183, 187, 312/188, 193.4, 223.1, 223.2; 361/686, 683, 726, 740, 759, 801; 439/135, 345; 174/35 R

[56] References Cited

U.S. PATENT DOCUMENTS

| | | | |
|---|---|---|---|
| 3,130,351 | 4/1964 | Giel | 361/759 |
| 3,283,263 | 11/1966 | Kosanda | 361/759 X |
| 3,386,012 | 5/1968 | Seelig | 361/801 X |
| 3,939,382 | 2/1976 | Lacan et al. | 361/759 X |
| 4,002,381 | 1/1977 | Wagner et al. | 312/183 |
| 4,227,238 | 10/1980 | Saito | 361/801 |
| 4,534,608 | 8/1985 | Scott et al. | 439/345 |
| 4,703,396 | 10/1987 | Fletcher | 361/759 X |
| 4,873,395 | 10/1989 | Mast | 174/35 GC |
| 5,004,867 | 4/1991 | Mast | 174/35 GC |
| 5,099,391 | 3/1992 | Maggelet et al. | 361/686 X |
| 5,207,593 | 5/1993 | Bogiel | 439/345 X |
| 5,249,977 | 10/1993 | Tanaka et al. | 439/135 |
| 5,264,986 | 11/1993 | Ohghami et al. | 361/740 X |
| 5,317,483 | 5/1994 | Swindler | 361/801 |
| 5,361,492 | 11/1994 | Miyazawa | 439/135 X |
| 5,373,133 | 12/1994 | Brockway et al. | 361/801 X |
| 5,398,156 | 3/1995 | Steffes et al. | 361/759 X |
| 5,428,507 | 6/1995 | Chatil et al. | 361/759 X |
| 5,483,420 | 1/1996 | Schiavini | 361/801 X |

OTHER PUBLICATIONS

IBB Technical Disclosure Bulletin, vol. 29, No. 10, Mar. 1987.

*Primary Examiner*—Peter M. Cuomo
*Assistant Examiner*—Rodney B. White
*Attorney, Agent, or Firm*—Haynes and Boone, L.L.P.

[57] ABSTRACT

An apparatus for the retention of computer expansion cards and filler panels. The apparatus includes a mount in the expansion card or filler panel having a first edge and a second edge, opposite the first edge, to position the expansion card or filler panel relative to a chassis. A slot is defined in the first edge of the mount and a post extends from the chassis so that the slot engages the post to retain the mount from moving in a first direction. A tab extends from the chassis so that the second edge engages the tab to retain the mount from moving in a second direction opposite said first direction and in a third direction perpendicular to said first direction. The tab may also engage a notch defined in an edge of the mount. The apparatus may also include a locking plate with at least one arm which retains the mount from moving in a fourth direction orthogonal to said first and third directions.

16 Claims, 4 Drawing Sheets

APPARATUS FOR RETENTION OF COMPUTER EXPANSION CARDS AND FILLER PANELS

TECHNICAL FIELD

The invention relates generally to personal computer expansion cards and filler panels and, more specifically, to an apparatus for the retention of expansion cards and filler panels and an aid for retaining expansion card and filler panels during assembly.

BACKGROUND OF THE INVENTION

Personal computers utilize circuit carrying boards housed in the computer's chassis as platforms to secure and interconnect individual electronic components. In order to provide consumer flexibility, these circuit boards are frequently designed to accommodate additional circuit boards, or expansion cards, to provide additional and/or alternative functionality. For example, many personal computer circuit boards are designed with expansion card slots for standard bus interfaces, such as ISA (Industry Standard Architecture) and EISA (Extended Industry Standard Architecture), into which expansion cards for peripheral devices, such as hard disk controllers, tape controllers, modems and other I/O controllers, may be connected. Many of these expansion cards require connections to devices and equipment external to the computer chassis itself. Accordingly, access points in the computer chassis adjacent to the expansion card connectors are provided to allow for connection between the expansion cards and peripheral devices.

In order to provide insulation against electromagnetic radiation and noise, and to protect against dirt and dust invasion, it is desirable to seal the access points in the chassis to the extent not required for external connection by an expansion card. Accordingly, the typical expansion card is provided with a cover which seals the access point while providing for external connections. When there is no expansion card in place, as is often the case when the computer leaves the factory, a filler panel is provided to seal the associated access point.

In order to provide economies of production, and for ease of use, a standard filler panel mounting arrangement has been developed for typical Microsoft DOS/Windows based personal computer chassis designs. The standard filler panel is essentially an L-shaped metal shield which incorporates a mount having a retention slot in the top side through which a screw is driven to secure the filler panel through a threaded hole to a lip in the chassis, or expansion card cage mounted within the chassis, adjacent the access point. The standard expansion card incorporates a similar access point mount, minus the panel, having a retention slot through which a screw is driven to secure the card with the chassis adjacent to the access point.

Unfortunately, the foregoing access mount, whether part of a filler panel or expansion card, provides for a retention slot having a length such that the placement of the filler panel or expansion card may vary relative to the threaded hole while the screw is driven. In the filler panel embodiment this results in inconsistent filler panel placement that may leave openings in the chassis between the misaligned filler and access point. This problem exhibits less frequently in the expansion card embodiment because the position of the expansion card and its related mount is fixed by the location of the expansion card connector, and the screw attachment to the chassis is merely used to provide additional horizontal and vertical support to protect the expansion card against shock and the like.

Because the filler panels are easily moved during assembly, the assembler must utilize two hands to secure the filler panel in the chassis (one hand to hold the filler panel in place and the second hand to drive the screw), thereby increasing assembly time. Moreover, by requiring a screw in the assembly process, an additional part for each expansion slot must be inventoried and maintained. Furthermore, screws may be lost or lodge against the circuit board, causing shorts and potential catastrophic failure of the system. Thus the foregoing access point mount, particularly in the filler panel embodiment, adds to installation time and increases inventory problems.

One solution to remedy these failures is to design the filler panel to provide a lip extended down from the back of the top of the filler panel which rests in a slot formed in the chassis. After the filler panel is in place with the lip holding it in position, a bar is lowered onto the top of the filler panel to hold it in place and to prevent horizontal movement away from the card cage. However, a draw back of this solution is that it cannot be used with conventional chassis designs that do not provide for such a slot to hold the panels in place.

As a consequence, what is needed is an improved alignment and retention mechanism for the access point mount of a filler panel or expansion card installed in the chassis of a computer.

SUMMARY OF THE INVENTION

The filler panel and expansion card retention apparatus of the present invention avoids and overcomes the above-mentioned disadvantages and drawbacks characteristic of the prior art. According to the present invention and in a departure from the prior art, the expansion card and filler panel retention apparatus consists of a mount in the expansion card or filler panel to position the expansion card or filler panel relative to a chassis. The mount has a first edge and a second edge opposite said first edge, a slot is defined in the first edge of the mount and a post extends from the chassis so that the slot engages the post to retain the mount from moving in a first direction. A tab extends from the chassis so that the second edge engages the tab to retain the mount from moving in a second direction opposite said first direction and in a third direction perpendicular to said first direction.

In another embodiment of the invention, a notch is defined in an edge of the mount, and the tab extends from the chassis so that the tab engages the notch to retain the mount from moving in a second direction opposite said first direction and in a third direction perpendicular to said first direction.

In another embodiment of the invention, the chassis includes a backplate having a first and second clip. Also included is a locking plate having a first end and a second end, the first end is insertable into the first clip and the second end is insertable into the second clip. At least one arm extends from the locking plate which retains the mount from moving in a fourth direction orthogonal to said first and second directions, which secures the mount to the chassis when the first end and said second end are inserted into the first and second clips.

The invention results in several technical advantages. Generally, the invention provides an aid for retaining expansion cards and filler panels during assembly and also provides for the screwless retention of filler panels and expansion cards.

DESCRIPTION OF THE PREFERRED EMBODIMENT

Figure 1:
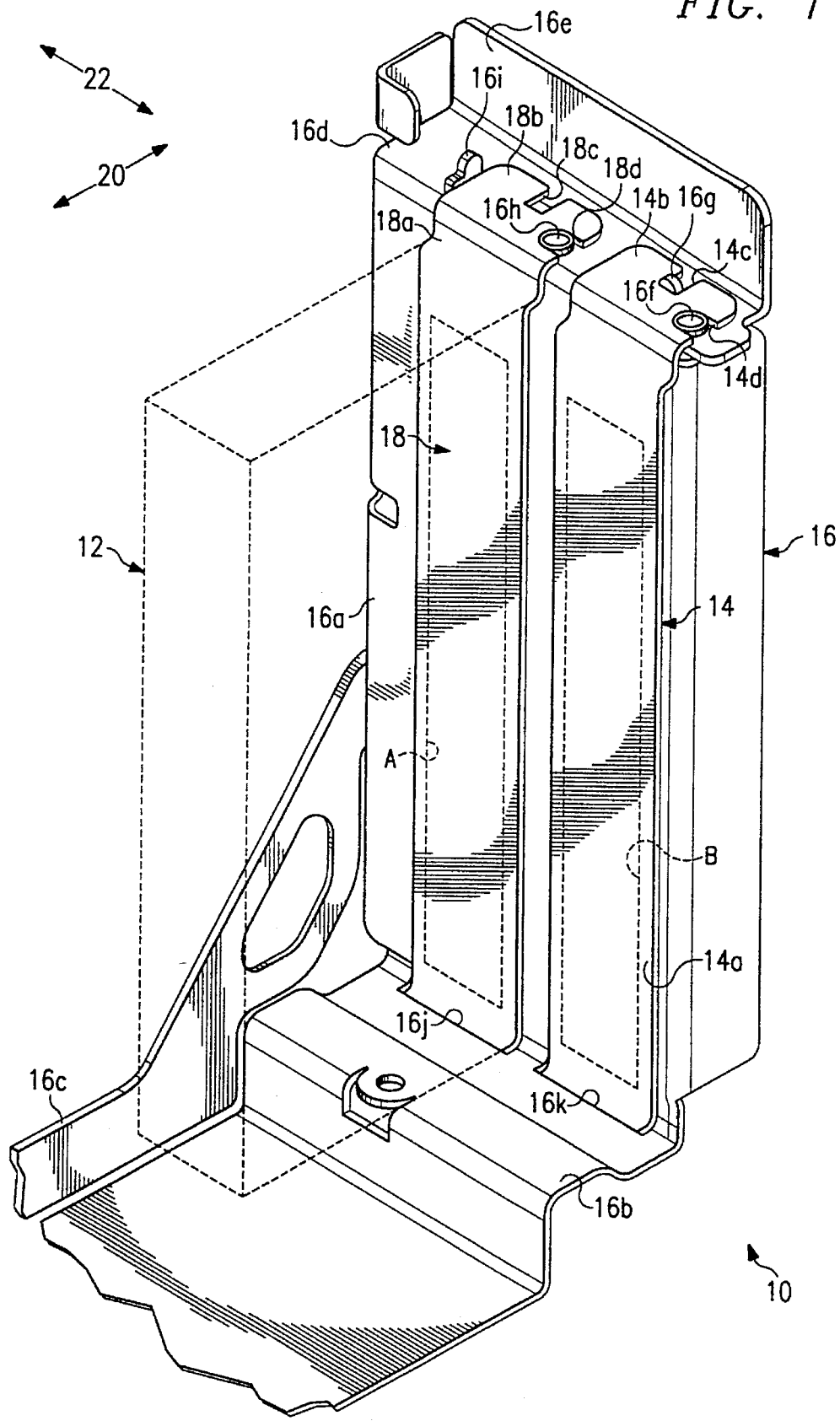
FIG. 1 is a broken away, perspective view of an expansion card and filler panel retention apparatus of the present invention.

In FIG. 1 the reference numeral 10 refers generally to an assembly for retaining an expansion card 12, and similarly a filler panel 14, in a personal computer chassis 16. The chassis 16 is either an expansion card cage for placement within a personal computer (not shown), or alternatively is part of the personal computer's main chassis, and is used to support expansion cards within the computer in a location for, in some instances, connections to devices outside the computer (also not shown). The chassis 16 includes (in the orientation illustrated) a vertical wall 16a connected to a horizontal floor 16b, further supported by a bracket 16c. The wall 16a defines openings, or access points A and B, illustrated in phantom by dashed-lines behind the card 12 and filler panel 14, respectively, for enabling the external connections mentioned. In accordance with the present invention, it is appreciated that during assembly of the chassis 16 the card 12 and filler panel 14 must be properly located over the access points A and B, retained in that location, and then secured to the chassis 16. Such operations must be performed quickly and easily on a computer assembly line and, as will be explained in detail below, are facilitated by the present invention.

The chassis 16 also includes a horizontal shelf 16d and vertical backplate 16e at the upper portion of the wall 16a. An elevated post 16f and a tab 16g are defined in the shelf 16d in proximity to the access point B, for locating and retaining the filler panel 14 relative to the access point B, as will be further described. An elevated post 16h and tab 16i are likewise defined in the shelf 16d in proximity to the access point A, for locating and retaining the card 12 relative to the access point A. As will be explained, the orientation of the tab 16i relative to the shelf 16d is different from that of the tab 16g. The differences in the tabs 16i, 16g represent alternative and interchangeable embodiments for performing the locating and retaining functions of the present invention for the card 12 and filler panel 14.

The card 12 includes a body (illustrated in phantom) containing the electronics of the card (not shown). The card 12 is connected to (or alternatively formed integral with) a substantially L-shaped bracket 18 comprising a support 18a and a mount 18b. Although not shown, it is understood the support 18a may define at least one opening therein for permitting connectors of the card 12 to communicate with devices outside the computer through the access point A. The mount 18b defines a notch 18c centrally located (generally) along the outer edge of the mount. The mount 18b also defines a slot 18d located along the side edge of the mount 18b.

The filler panel 14 is substantially L-shaped and includes a shield 14a and a mount 14b. When the filler panel 14 is installed the shield 14a is utilized to cover the access point B thereby protecting the interior of the computer. The mount 14b defines a notch 14c centrally located (generally) along the outer edge of the mount. The mount 14b also defines a slot 14d located along the side edge of the mount 14b.

Operation of the assembly 10 will now be described. On a computer manufacturing line, or otherwise in assembling the above described components, the expansion card 12 is located precisely over the access point A to allow access from outside the computer to the card's 12 connectors. Once so located the card 12 is then retained, as explained below, in such precise location until it can be secured in place by a screw (not shown) or other mechanism, including the mechanism explained more fully with reference to FIGS. 2–4.

First, the card 12 is manually located in the precise position over the access point A. Although not required, in one embodiment a slot 16j, defined at the intersection of the wall 16a and floor 16b, receives the bottom end of the bracket support 18a. The mount 18b is then manipulated to engage the surface of the chassis shelf 16d such that the bracket slot 18d engages the post 16h, thereby properly locating the bracket 18 (and hence card 12) relative to the chassis wall 16a in a perpendicular direction relative to the chassis wall 16a, as represented by the arrow 20. The post 16h retains the bracket 18 so that it does not move in the first direction defined by the arrow 20.

When the mount 18b engages the surface of the chassis shelf 16d, the side of the mount 18b opposite the slot 18d also engages the flat surface of the tab 16i. Thus the tab 16i, in combination with the post 16h engaging the internal surface of the mount 18b defined by the slot 18d, prevents the mount 18b (and hence the card 12) from moving in a lateral direction relative to the chassis wall 16a, as defined by the arrow 22. The card 12 is thus retained in place from moving in a perpendicular 20 and a lateral 22 direction with respect to the chassis wall 16a.

Since the mount 18b is retained as indicated but not fully secured, it is understood the mount 18b, and hence card 12, is capable of moving upwardly away from the shelf 16d. In the present embodiment, it is understood the post 16h defines an opening in the shelf 16d so that a screw (not shown) can be installed in the opening defined by the post to thereby secure the mount 18b, and hence card 12, in place. The opening defined by the post 16h may be, but is not necessarily, threaded.

The filler panel 14 is located, retained and secured with respect to the chassis wall 16a in a similar manner to that just described for the card 12. Accordingly, the post 16f prevents movement of the mount 14b in a perpendicular direction as defined by the arrow 20. A difference from the foregoing, however, is that the notch 14c receives the tab 16g when the mount 14b engages the shelf 16d. This serves to properly locate, and then retain, the mount 14b in a lateral direction relative to the chassis wall 16a, as defined by the arrow 22. The mount 14b is then secured by a screw (not shown) to the shelf 16d through the post 16f. It is understood that for embodiments of filler panels 14 that do not include a notch 14c, the locating and retaining arrangement first described with reference to the card 12 should be employed, wherein a tab such as the tab 16i is located to engage the side of the mount 14b.

Figure 2:
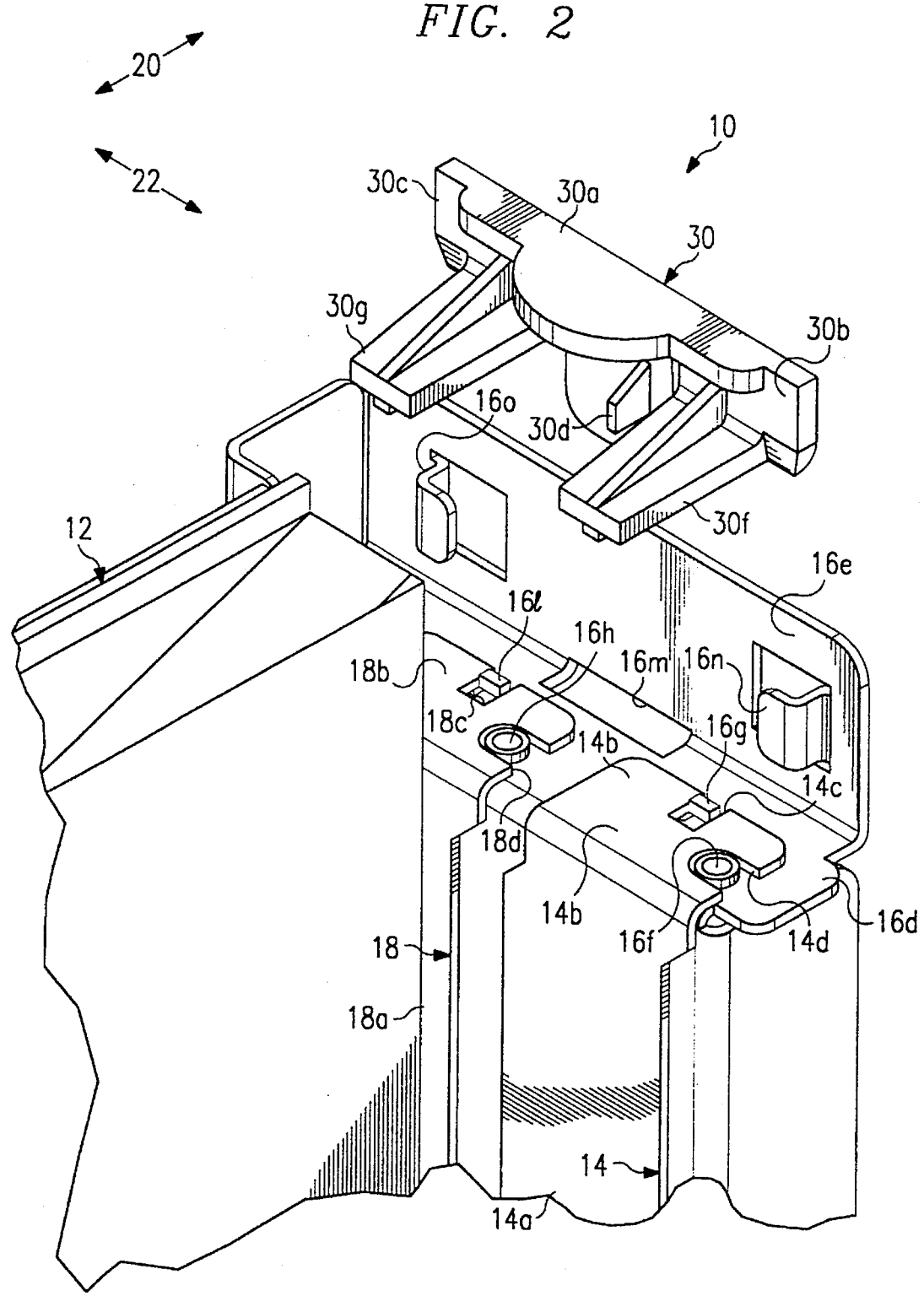
FIG. 2 is an enlarged, broken away perspective view of the expansion card and filler panel retention apparatus of FIG. 1 further including a locking plate.

In FIG. 2 tab 16i has been replaced with tab 16l for use in connection with the embodiment discussed in connection with the filler panel 14 of FIG. 1, although either embodiment shown in FIG. 1 could be utilized. The chassis 16 additionally includes an aperture 16m defined in the shelf 16d which is proximate the backplate 16e, and opposing first and second clips 16n, 16o, located in the vertical backplate 16e. Also shown in FIG. 2 is a locking plate 30 to secure the card 12 and filler panel 14 to the shelf 16d as explained in detail below. The locking plate 30 includes an elongated body 30a with first end 30b and a second end 30c, a stop tab 30d, and a catch 30e (shown in FIG. 4). Extending substantially perpendicular away from the body 30a are two arms 30f, 30g.

Operation of the locking plate 30 will now be described. The card 12 and filler panel 14 are retained with respect to the chassis wall 16a as explained in connection with the filler panel 14 embodiment shown in FIG. 1. This prevents the card 12 and filler panel 14 from moving both laterally (as defined by the arrow 20) and perpendicularly (as defined by the arrow 22) with respect to the chassis wall 16a. However, the card 12 and filler panel 14 are both capable of moving upwardly away from the shelf 16d. In order to secure the card 12 and filler panel 14 to the shelf 16d the locking plate 30 is secured to the chassis 16 over the card 12 and filler panel 14.

The locking plate 30 is secured to the chassis 16 by inserting the ends 30b, 30c of the locking plate body 30a into clips 16n, 16o, respectively, in the backplate 16e. The clips 16n, 16o retain the locking plate 30 to the backplate 16e and restrict movement of the locking plate 30 both perpendicularly (as defined by arrow 20) and laterally (as defined by arrow 22) relative to the chassis wall 16a. As the locking plate 30 is inserted into clips 16n, 16o the arm 30f is lowered onto the top of mount 14b of the filler panel 14, and arm 30g is lowered onto the top of mount 18b of the card 12. The ends 30b, 30c are further inserted into clips 16n, 16o, which forces the catch 30e through the aperture 16m in the shelf 16d. The catch 30e then becomes secured to the backplate 16e through the aperture 16m, and stop 30d rests on the shelf 16d. With the catch 30e secured to the backplate 16e and the stop 30d resting on the shelf 16d the locking plate 30 is restricted from moving perpendicularly to shelf 16d. With the locking plate 30 so secured to the chassis 16, the arms 30f, 30g prohibit movement of the card 12 and filler panel 14 upwardly away from the shelf 16d, thus securing the card 12 and filler panel 14 to the chassis 16 in the proper location.

Figure 3:
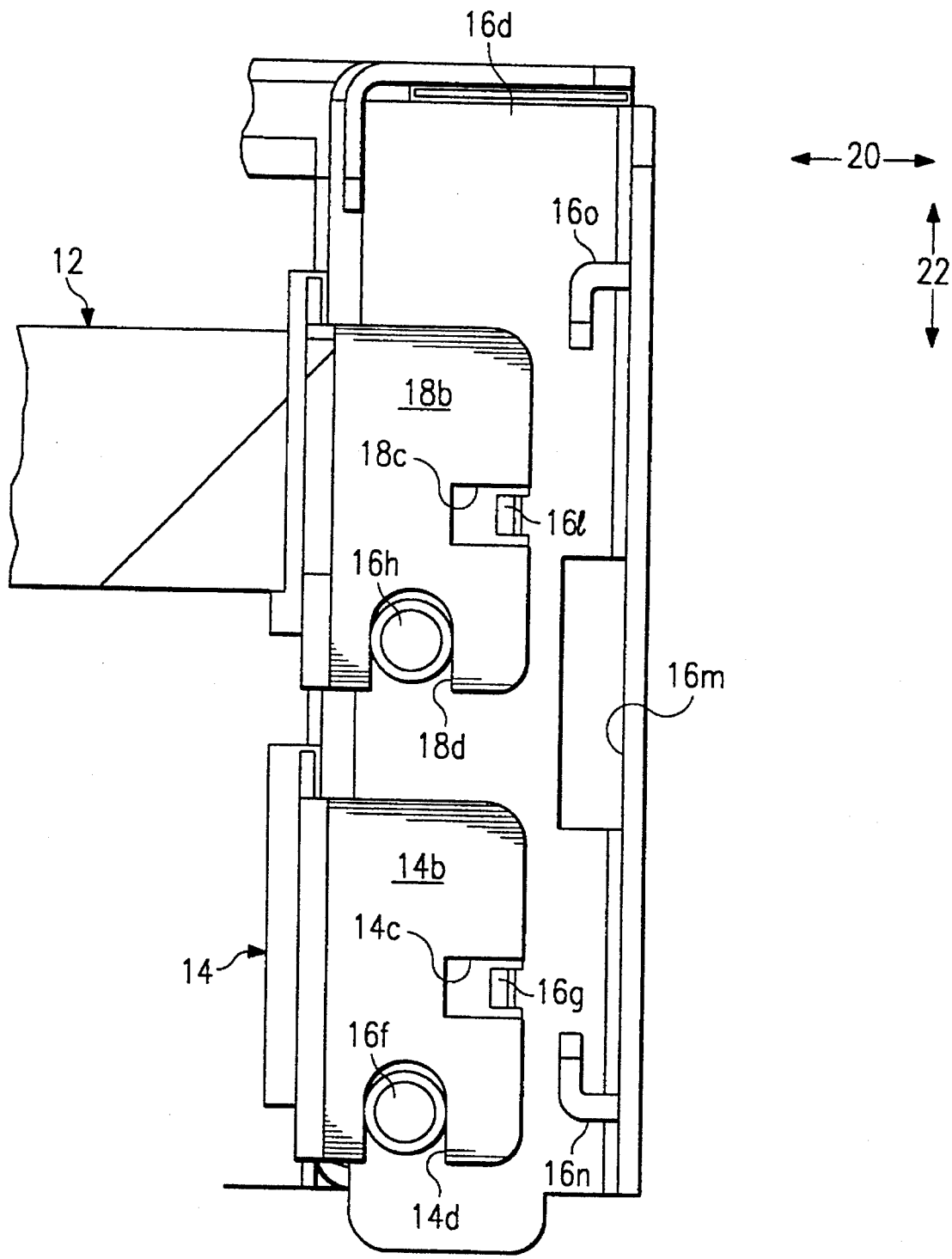
FIG. 3 is an enlarged, broken away overhead view of the expansion card and filler panel retention apparatus of FIG. 2.

FIG. 3 is an overhead view of the card 12 and filler panel 14 of FIG. 2 properly located on the shelf 16d to cover the access points A and B, respectively (not shown). As shown, the mount 14b of the filler panel 14 is set on the shelf 16d such that the tab 16g rests within the notch 14c and the post 16f rests with the slot 14d. The tab 16g and post 16f simultaneously locate the filler panel 14 in its proper position and restrict movement of the filler panel 14 relative to the chassis wall 16a in both the perpendicular (as represented by the arrow 20) and lateral (as represented by the arrow 22) directions. Card 12 is similarly restricted from movement relative to the chassis wall 16a by the post 16h and the tab 16l.

Figure 4:
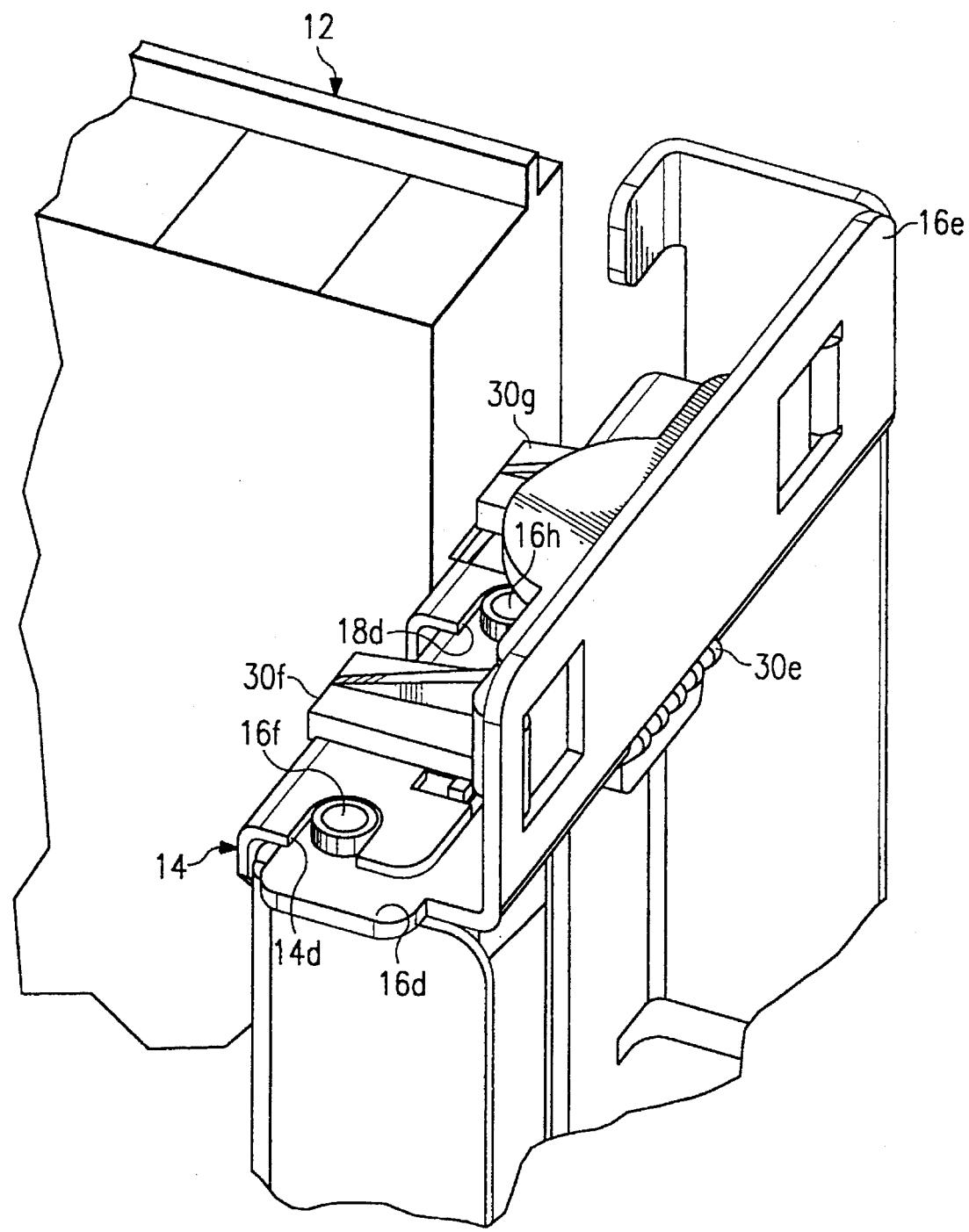
FIG. 4 is an enlarged, broken away, perspective view of the expansion card and filler panel retention apparatus of FIG. 2 with the locking plate in a secured position.

FIG. 4 illustrates a back perspective view of the chassis 16 of FIG. 2 with the locking plate 30 inserted in the backplate 16e. With the locking plate 30 secured to the backplate 16e the arms 30f, 30g are secured on top of mounts 14b and 18b, respectively, restricting movement of the filler panel 14 and card 12 in the upward direction away from shelf 16d. Catch 30e is shown inserted through aperture 16m and engaging the underside of the backplate 16e which restricts the upward movement of locking plate 30 away from the shelf 16d.

Several technical advantages result from the foregoing. Because the posts 16f, 16h and tabs 16g, 16l properly position the filler panel 14 and card 12 and secure the same to the shelf 16d, assemblers are able to place filler panels and expansion cards in a chassis 16 with increased assembly speed and accuracy. Because the standard design of the filler panel 14 is retained, manufacturers need not stock multiple filler panel designs. Further, utilizing the locking plate 30, manufacturers are able to eliminate additional screws from their inventory and use a single component to secure filler panels and expansion cards to the chassis. These advantages lead to consistent placement of expansion cards and, particularly, filler panels which provides for better protection from electromagnetic radiation, noise, and dirt and dust invasions.

Although an illustrative embodiment of the invention has been shown and described, other modifications, changes, and substitutions are intended in the foregoing disclosure. For example, the shelf 16d may contain any number of post and tab pairs to allow for the connection of any number of filler panels and expansion cards. The locking plate may be secured to the shelf 16d by any means that restricts movement of the locking bar in an upward direction away from the shelf 16d. Further, the locking plate 30 may contain any number of arms to secure any number of filler panels and expansion cards. Accordingly, it is appropriate that the appended claims be construed broadly and in a manner consistent with the scope of the invention.

What is claimed is:

1. Apparatus for retaining a card or filler panel mount in position relative to a chassis, said mount including a first edge and a second edge opposite said first edge, the apparatus comprising:

a slot defined in said first edge of said mount;

a post extending from said chassis so that said slot engages said post to retain said mount from moving in a first direction; and a tab extending from said chassis so that said second edge engages said tab to retain said mount from moving in a second direction opposite said first direction and in a third direction perpendicular to said first direction.

2. The apparatus of claim 1, further comprising an opening defined in said post, so that a fastener received in said post retains said mount from moving in a fourth direction orthogonal to said first and third directions, thereby securing said mount to said chassis.

3. The apparatus of claim 2 wherein said opening is a threaded bore and said fastener is a screw.

4. The apparatus of claim 1, further comprising:

said chassis including a shelf for receiving said mount;

said chassis including a backplate extending substantially orthogonal to said shelf, said backplate having a first and second clip; and a locking plate having a first end and a second end, said first end insertable into said first clip and said second end insertable into said second clip, at least one arm extending from said locking plate which retains said mount from moving in a fourth direction orthogonal to said first and third directions, thereby securing said mount to said chassis when said first end and said second end are inserted into said first and second clips.

5. The apparatus of claim 4, further comprising:

said chassis including an aperture; and said locking plate having a catch for insertion into said aperture and to secure said locking plate to said chassis.

6. Apparatus for retaining a card or filler panel mount in position relative to a chassis, said mount including first and second edges, the apparatus comprising:

a slot defined in said first edge of said mount and a notch defined in said second edge;

a post extending from said chassis so that said slot engages said post to retain said mount from moving in a first direction; and a tab extending from said chassis so that said tab engages said notch to retain said mount from moving in a second direction opposite said first direction and in a third direction perpendicular to said first direction.

7. The apparatus of claim 6, further comprising an opening defined in said post, so that a fastener received in said post retains said mount from moving in a fourth direction orthogonal to said first and third directions, thereby securing said mount to said chassis.

8. The apparatus of claim 7 wherein said opening is a threaded bore and said fastener is a screw.

9. The apparatus of claim 6, further comprising:

said chassis including a shelf for receiving said mount;

said chassis including a backplate extending substantially orthogonal to said shelf, said backplate having a first and second clip; and a locking plate having a first end and a second end, said first end insertable into said first clip and said second end insertable into said second clip, at least one arm extending from said locking plate which retains said mount from moving in a fourth direction orthogonal to said first and third directions, thereby securing said mount to said chassis when said first end and said second end are inserted into said first and second clips.

10. The apparatus of claim 9, further comprising:

said chassis including an aperture; and said locking plate having a catch for insertion into said aperture and to secure said locking plate to said chassis.

11. Apparatus for retaining a card or filler panel mount in position relative to a chassis, the apparatus comprising:

said chassis including a Shelf for receiving said mount;

said chassis including a backplate extending substantially orthogonal to said shelf, said backplate having a first and second clip; and a locking plate having a first end and a second end, said first end insertable into said first clip and said second end insertable into said second clip, at least one arm extending from said locking plate which retains said mount from moving relative to said chassis when said first end and said second end are inserted into said first and second clips.

12. The apparatus of claim 11, further comprising:

said chassis including an aperture; and said locking plate having a catch for insertion into said aperture and to secure said locking plate to said chassis.

13. Apparatus for retaining a card or filler panel mount in position relative to a chassis, said mount including a first edge and a second edge opposite said first edge, the apparatus comprising:

an opening defined in said first edge of said mount;

a means for coupling with said opening to retain said mount from moving in a first direction; and a means for engaging said second edge to retain said mount from moving in a second direction opposite said first direction and in a third direction perpendicular to said first direction.

14. The apparatus of claim 13, further comprising:

said chassis including a shelf for receiving the mount;

said chassis including a backplate substantially orthogonal to the shelf;

a means for attaching a locking plate to said backplate;

said locking plate having a means for retaining said mount from moving in a fourth direction orthogonal to said first and third directions when said locking plate is secured to said backplate by said attaching means.

15. Apparatus for retaining a card or filler panel mount in position relative to a chassis, said mount including first and second edges, the apparatus comprising:

a first opening defined in said first edge of said mount and a second opening defined in said second edge;

a first means for coupling with said first opening to retain said mount from moving in a first direction; and a second means for coupling with said second opening to retain said mount from moving in a second direction opposite said first direction and in a third direction perpendicular to said first direction.

16. The apparatus of claim 15, further comprising:

a means for attaching a locking plate to said chassis;

said locking plate having a means for retaining said mount from moving in a fourth direction orthogonal to said first and third directions when said locking plate is secured to said chassis by said attaching means.

\* \* \* \* \*

UNITED STATES PATENT AND TRADEMARK OFFICE
CERTIFICATE OF CORRECTION

PATENT NO.  : 5,575,546
DATED       : July 21, 1995
INVENTOR(S) : Timothy Radloff et al It is certified that error appears in the above-indentified patent and that said Letters Patent is hereby corrected as shown below:

On the title page: Item [75] Inventor: should read -- Timothy Radloff, Austin, Tx. and Gilberto Hernandez, Pflugerville, Tx. --.

Signed and Sealed this

Eleventh Day of March, 1997

Attest:

BRUCE LEHMAN

*Attesting Officer*  *Commissioner of Patents and Trademarks*